United States Patent
Popp et al.

(10) Patent No.: US 9,172,042 B2
(45) Date of Patent: Oct. 27, 2015

(54) ORGANIC, RADIATION-EMITTING COMPONENT AND METHOD FOR PRODUCING SUCH A COMPONENT

(75) Inventors: Michael Popp, Munich (DE); Nina Riegel, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1199 days.

(21) Appl. No.: 13/127,208

(22) PCT Filed: Oct. 19, 2009

(86) PCT No.: PCT/DE2009/001450
§ 371 (c)(1),
(2), (4) Date: Jul. 25, 2011

(87) PCT Pub. No.: WO2010/048923
PCT Pub. Date: May 6, 2010

(65) Prior Publication Data
US 2011/0303932 A1     Dec. 15, 2011

(30) Foreign Application Priority Data
Oct. 30, 2008  (DE) .......................... 10 2008 054 052

(51) Int. Cl.
H01J 1/62     (2006.01)
H01L 33/00    (2010.01)
H01L 51/00    (2006.01)
H01L 51/50    (2006.01)

(52) U.S. Cl.
CPC ......... H01L 51/0002 (2013.01); H01L 51/5012 (2013.01)

(58) Field of Classification Search
USPC .......................................................... 257/94
See application file for complete search history.

(56) References Cited

U.S. PATENT DOCUMENTS

| | | |
|---|---|---|
| 5,220,183 A | 6/1993 | Taniguchi et al. |
| 6,097,147 A | 8/2000 | Baldo et al. |
| 6,337,102 B1 | 1/2002 | Forrest et al. |
| 7,019,449 B2 | 3/2006 | McCreery |
| 7,132,787 B2 | 11/2006 | Ozkan et al. |
| 7,285,907 B2 | 10/2007 | D'Andrade et al. |
| 7,355,197 B2 | 4/2008 | Blochwitz-Nimoth |
| 2004/0202875 A1* | 10/2004 | Yitzchaik ...................... 428/457 |
| 2004/0222736 A1* | 11/2004 | Yoneda .......................... 313/503 |

(Continued)

FOREIGN PATENT DOCUMENTS

| | | |
|---|---|---|
| DE | 103 39 772 | 4/2005 |
| DE | 10 2007 058 005 | 4/2009 |

(Continued)

OTHER PUBLICATIONS

"Atomic layer deposition: an overview" by Steven M. George; American Chemical society 2010 10.1021cr900056b.*

(Continued)

*Primary Examiner* — Cuong Q Nguyen
*Assistant Examiner* — Nishath Yasmeen
(74) *Attorney, Agent, or Firm* — Cozen O'Connor

(57) ABSTRACT

A method for producing an organic, radiation-emitting component is specified, wherein at least one layer (10) containing an emitter material is produced in a radiation-emitting region (4) of the component, wherein the layer (10) is produced by means of atomic layer deposition and has a thickness of at most 2 nm.

8 Claims, 4 Drawing Sheets

(56) References Cited

U.S. PATENT DOCUMENTS

| | | | |
|---|---|---|---|
| 2005/0260449 A1* | 11/2005 | Walters et al. | 428/690 |
| 2006/0279203 A1* | 12/2006 | Forrest et al. | 313/504 |
| 2007/0126350 A1 | 6/2007 | Lee et al. | |
| 2007/0138947 A1 | 6/2007 | Popovic et al. | |
| 2007/0171525 A1* | 7/2007 | Miller et al. | 359/467 |
| 2009/0206732 A1 | 8/2009 | Seo et al. | |
| 2010/0314648 A1 | 12/2010 | Fehrer et al. | |

FOREIGN PATENT DOCUMENTS

| | | |
|---|---|---|
| EP | 1 804 308 | 7/2007 |
| JP | 03-179690 | 8/1991 |
| JP | 04-126391 | 4/1992 |
| JP | 2002-237388 | 8/2002 |
| JP | 2004-018399 | 1/2004 |
| JP | 2006-219641 | 8/2006 |
| JP | 2007-042624 | 2/2007 |
| JP | 2007-073315 | 3/2007 |
| JP | 2007-171614 | 7/2007 |
| JP | 2007-173827 | 7/2007 |
| KR | 10 2004 0078562 | 9/2004 |
| KR | 10 2008 0086994 | 9/2008 |
| WO | WO 2004/105149 | 12/2004 |
| WO | WO 2006071126 A1 * | 7/2006 ............. C23C 16/00 |
| WO | WO 2007/071451 | 6/2007 |
| WO | WO 2007/091805 | 8/2007 |
| WO | WO 2008/111850 | 9/2008 |
| WO | WO2008/111850 A2 * | 9/2008 ............. C23C 16/30 |

OTHER PUBLICATIONS

Chan, J. et al. "Organic Quantum Well Light Emitting Diodes", Proceedings of SPIE; Photonics: Design Technology and Packaging II; vol. 1, No. 6038; pp. 1-11; 2006.

* cited by examiner

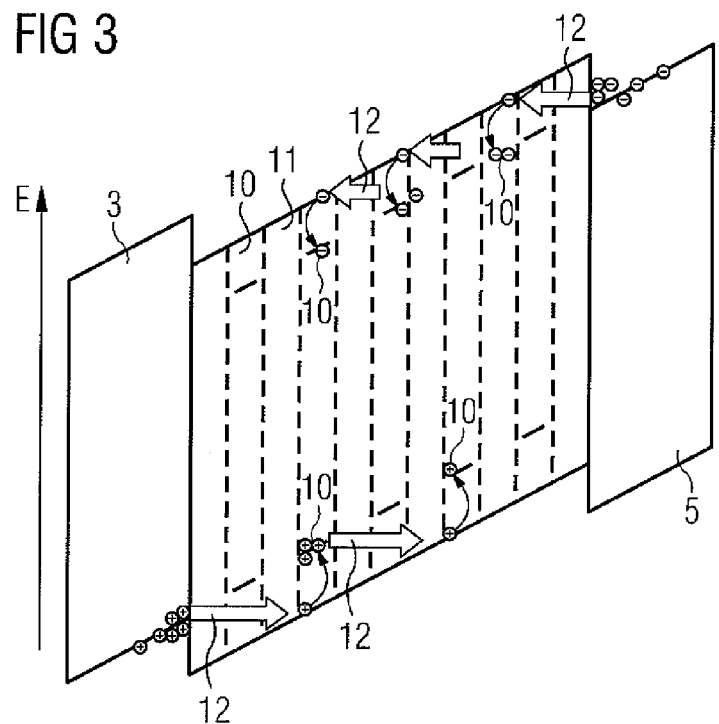
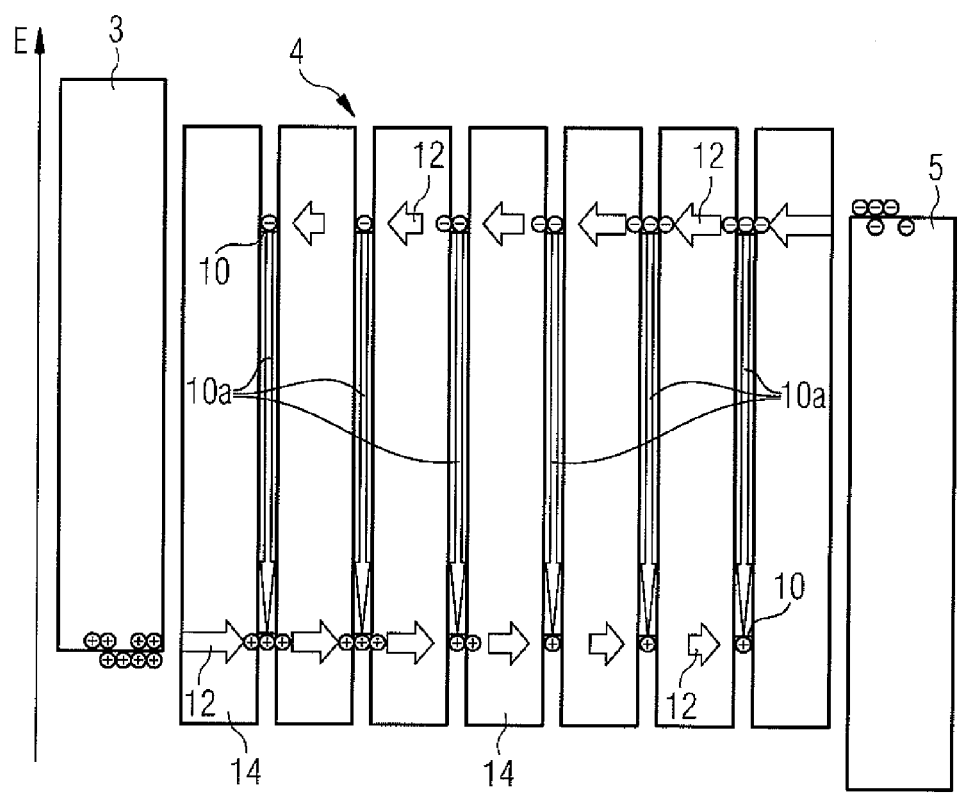

ORGANIC, RADIATION-EMITTING COMPONENT AND METHOD FOR PRODUCING SUCH A COMPONENT

RELATED APPLICATIONS

This is a U.S. national stage of application No. PCT/DE2009/001450, filed on Oct. 19, 2009.

This application claims the priority of German application no. 10 2008 054 052.8 filed Oct. 30, 2008, the entire content of which is hereby incorporated by reference.

BACKGROUND OF THE INVENTION

A method for producing an organic, radiation-emitting component is specified. Furthermore, an organic, radiation-emitting component is specified.

The document U.S. Pat. No. 7,285,907 B2 describes an organic, radiation-emitting component.

SUMMARY OF THE INVENTION

One object of the invention is to provide an organic, radiation-emitting component which can be produced more simply by comparison with the prior art. A further object to be achieved consists, inter alia, in specifying a method for producing such a component.

According to at least one embodiment of the method for producing an organic, radiation-emitting component, a radiation-emitting region is produced during the production of the component. The radiation-emitting region of the component is that region which generates electromagnetic radiation when an electric current is applied to the component, that is to say, during the operation of the component. The radiation-emitting region of the component therefore comprises at least one layer in which electromagnetic radiation is generated by recombination of charge carriers.

In accordance with at least one embodiment of the method, at least one layer containing an emitter material is produced during the production of the radiation-emitting region of the component. Said layer is then an emission layer in which electromagnetic radiation is generated during operation of the component by means of recombination of charge carriers. The emitter material is preferably an organic material.

In accordance with at least one embodiment of the method for producing an organic, radiation-emitting component, at least the layer containing an emitter material is produced by means of atomic layer deposition (ALD). Atomic layer deposition is a variant of chemical vapor deposition (CVD). During atomic layer deposition, layer growth takes place in a cyclic manner in this case. A certain amount of the material to be deposited is deposited during each cycle in this case. Each cycle can in this case last between approximately 0.5 and a plurality of seconds, approximately 0.1 to 3 Å of thickness of the deposited layer being produced per cycle. That is to say that, by means of atomic layer deposition, it is possible to produce small layer thicknesses of the emitter layer. In this case the layer thickness is dependent only on the number of cycles, which allows particularly exact and simple control of the layer thickness. That is to say, that a predefined layer thickness can be grown particularly exactly in a very simple manner by means of the control of the coating time. Therefore, atomic layer deposition is a method with particularly good reproducibility.

In accordance with at least one embodiment of the method for producing an organic, radiation-emitting component, the thickness of the at least one layer containing an emitter material is less than 5 nm, preferably at most 2 nm. Furthermore, however, even thinner layer thicknesses are possible. Thus, it is possible for the thickness of a layer containing an emitter material to be at most one monolayer or to be in the submonolayer range.

That is to say, the production of very thin emitter layers is possible by means of atomic layer deposition. The amount of emitter material, that is to say the doping concentration of the emitter material, can be determined in a particularly simple manner by means of the duration of the deposition of the emitter material. Laborious, otherwise necessary and time-consuming stabilizations of the deposition rates, as is the case in other vaporization methods, for example, are obviated in this way. Furthermore, the combination of a plurality of materials, for example the combination of hole- and electron-conducting materials, is possible particularly well by means of atomic layer deposition.

In this case, it is possible for all layers of the radiation-emitting region to be produced by means of atomic layer deposition. That is to say, the entire radiation-emitting region is then produced by means of atomic layer deposition.

In accordance with at least one embodiment of the method for producing an organic, radiation-emitting component as described here, at least one layer containing an emitter material is produced in a radiation-emitting region of the component, wherein the layer is produced by means of atomic layer deposition. In this case, the thickness of the layer is at most 2 nm.

Furthermore, an organic, radiation-emitting component is specified. In accordance with at least one embodiment of the organic, radiation-emitting component, the component comprises a radiation-emitting region in which electromagnetic radiation is generated during the operation of the component. The electromagnetic radiation is preferably generated by recombination of charge carriers.

In accordance with at least one embodiment of the organic, radiation-emitting component, the radiation-emitting component in this case comprises at least one layer which contains an emitter material and has a thickness of at most 2 nm.

Such a thin layer composed of or comprising emitter material can be produced particularly simply by means of atomic layer deposition. On account of such a thin layer comprising emitter material, very efficient injection and increased charge carrier trapping in the layer comprising emitter material are possible. The component described here is therefore distinguished by an increased efficiency. Furthermore, on account of the use of the atomic layer deposition of individual layers of the component, control of the layer thickness right into the monomolecular and submolecular range is possible. That is to say, right into the monomolecular and submolecular range, any desired material combinations can be produced in the vapor deposition process, as a result of which a strict division of the structure sequences in the radiation-emitting region is resolved. This makes it possible to produce organic, radiation-emitting components which can be adapted particularly well to the use requirements thereof. In contrast thereto, known organic, radiation-emitting components exhibit a layer construction having a limited number of layers and a minimum layer thickness in the region of 5 nm. In this case, the layer construction is strictly classified into functional layers such as electron and hole conductors, electron and hole barrier layers and layers comprising emitter material.

Advantageous embodiments for the method described here and also the organic, radiation-emitting component described here are presented below. In this case, the features disclosed in this context respectively relate both to the production method and to the organic, radiation-emitting component to be produced.

In accordance with at least one embodiment, the radiation-emitting component contains in the radiation-emitting region at least two layers each containing an emitter material. The emitter materials of the layers can be the same or different emitter materials. In this case, the radiation-emitting region can comprise two, three or more layers each containing an emitter material. In this case, the layers can comprise different emitter material in pairs, or some of the layers through to all of the layers can contain the same emitter material.

In accordance with at least one embodiment, the at least two layers each containing an emitter material are in this case produced by means of atomic layer deposition. That is to say, two, more or all layers of the component which contain an emitter material are produced by means of atomic layer deposition.

In accordance with at least one embodiment, at least one layer consisting of at least one matrix material is produced in the radiation-emitting region of the component. In this case, the layer can consist of a hole-conducting matrix material. Furthermore, the layer can consist of an electron-conducting matrix material. Preferably, the layer comprises at least two matrix materials: at least one electron-conducting matrix material and at least one hole-conducting matrix material, which can be mixed with one another in the layer. In this case, the layer can likewise be produced by means of atomic layer deposition, which allows particularly good control of the layer thickness.

By way of example, the radiation-emitting region can be produced by alternately depositing a layer consisting at least of a matrix material and a layer containing at least one matrix material doped with an emitter material. That is to say, matrix material and matrix material with emitter material are produced alternately by means of atomic layer deposition.

It has been found in this case that this structure—particularly if it is produced by means of atomic layer deposition—improves the charge carrier trapping in the layers containing an emitter material. In this case, the layer thickness of each layer can be set individually right into the monolayer or submonolayer range. That is to say, layers consisting of at least one matrix material and also layers containing an emitter material can have thicknesses of less than 0.5 nm.

In accordance with at least one embodiment, the radiation-emitting region comprises at least one layer consisting of at least one barrier material, wherein the barrier material has a larger band gap than the matrix material.

The barrier material is, for example, an electron-blocking material, a hole-blocking material or particularly preferably a combination of an electron-blocking material and a hole-blocking material. In this case, the at least one layer containing a barrier material is preferably likewise produced by means of atomic layer deposition. That is to say that the thickness of this layer, too, can be at most 2 nm or less.

By way of example, the thickness of this layer can also lie in the monolayer or submonolayer range. In this case, it is possible that, in the radiation-emitting region of the component, layers containing at least one barrier material alternate with layers containing an emitter material. An arrangement of this type further improves the trapping of charge carriers in the layers containing an emitter material. A structure of this type is comparable, for example, with quantum wells in an inorganic semiconductor material. That is to say, the structure described here could also be described as an organic quantum well structure.

In accordance with at least one embodiment, the radiation-emitting region comprises at least two layers each consisting of at least one barrier material, wherein at least one layer containing an emitter material is arranged between these two layers. In this case, the organic, radiation-emitting component can have, in its radiation-emitting region, a plurality of layers comprising emitter material which are each arranged between two layers composed of at least one barrier material.

As a result, in other words, a radiation-emitting region is specified which comprises a multiplicity of organic quantum wells. In this case, the barrier material improves the trapping of charge carriers in the emission zone, that is to say in the layers containing an emitter material. In this case, the layers composed of at least one barrier material can have a thickness in the range of a few monolayers down to the submonolayer range. They control the injection of charge carriers in the layers containing an emitter material. In this case, all layers can be produced by means of atomic layer deposition, for example. Particularly precise control of the layer thicknesses is possible in this way.

In accordance with at least one embodiment, the matrix material of at least one layer in the radiation-emitting region of the component is formed by an emitter material designed to emit radiation in the wavelength range of blue light. At least one layer, preferably a plurality of layers, containing an emitter material can then be introduced into said matrix material. Said emitter material is then suitable for emitting radiation in a higher wavelength range than blue light. The emitter material in the layers is a phosphorescent emitter material, for example. The emitter material forming the matrix material for the emitter material in the layers can be fluorescent. In this case, it is also possible for charge carriers not to be directly trapped by the emitter material in the layers, rather for charge carriers initially to relax non-radiatively from the energetically higher emitter material of the matrix material to the energetically lower emitter materials of the layers and then to recombine radiatively.

In accordance with at least one embodiment, the radiation-emitting region in this case comprises at least two layers each containing a mutually different emitter material. Thus, by way of example, the matrix material can contain an emitter material that emits blue light during the operation of the component. Furthermore, the radiation-emitting region can contain layers comprising emitter material, wherein at least one layer emits red light and at least one layer emits green light.

BRIEF DESCRIPTION OF THE DRAWINGS

The method described here and also the component described are described in greater detail below on the basis of exemplary embodiments and with reference to the associated figures.

In conjunction with FIGS. 1 to 6, exemplary embodiments of the organic, radiation-emitting component described here and also of the method for producing said component are explained in greater detail on the basis of schematic illustrations.

DETAILED DESCRIPTION OF THE DRAWINGS

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford a better understanding.

Figure 1:
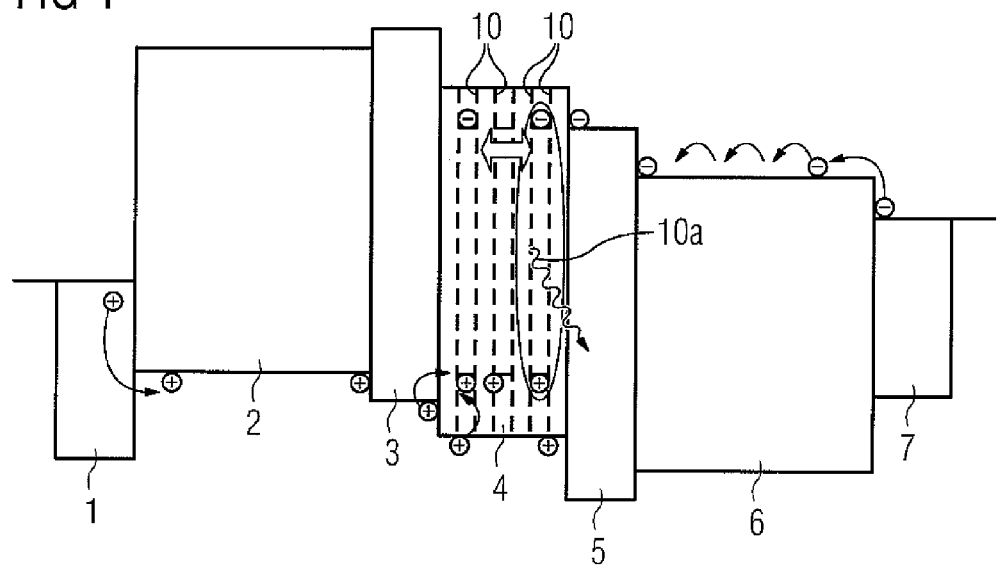

FIG. 1 shows the construction of an organic, radiation-emitting component in accordance with one exemplary embodiment on the basis of a schematic illustration. The organic, radiation-emitting component is, for example, an organic light-emitting diode (OLEO).

The component comprises an anode 1 as first electrode. The anode 1 is adjoined by a hole transport layer 2, which transports positive charge carriers into the radiation-emitting region 4.

The hole transport layer 2 is succeeded by an electron barrier layer 3, which prevents the penetration of electrons from the radiation-emitting region 4 into the hole transport layer 2.

The radiation-emitting region 4 is embodied according to one of the embodiments described here. Furthermore, the radiation-emitting region 4 is produced according to one of the methods described here. In the radiation-emitting region 4 the emission 10a of electromagnetic radiation occurs in the layers 10 containing an emitter material.

The radiation-emitting region 4 is succeeded by a hole barrier layer 5, which prevents the penetration of positive charge carriers into the adjoining electron transport layer 6.

The electron transport layer 6 transports negative charge carriers, electrons, from the second electrode, which is embodied as cathode 7, to the radiation-emitting region 4.

Figure 2:
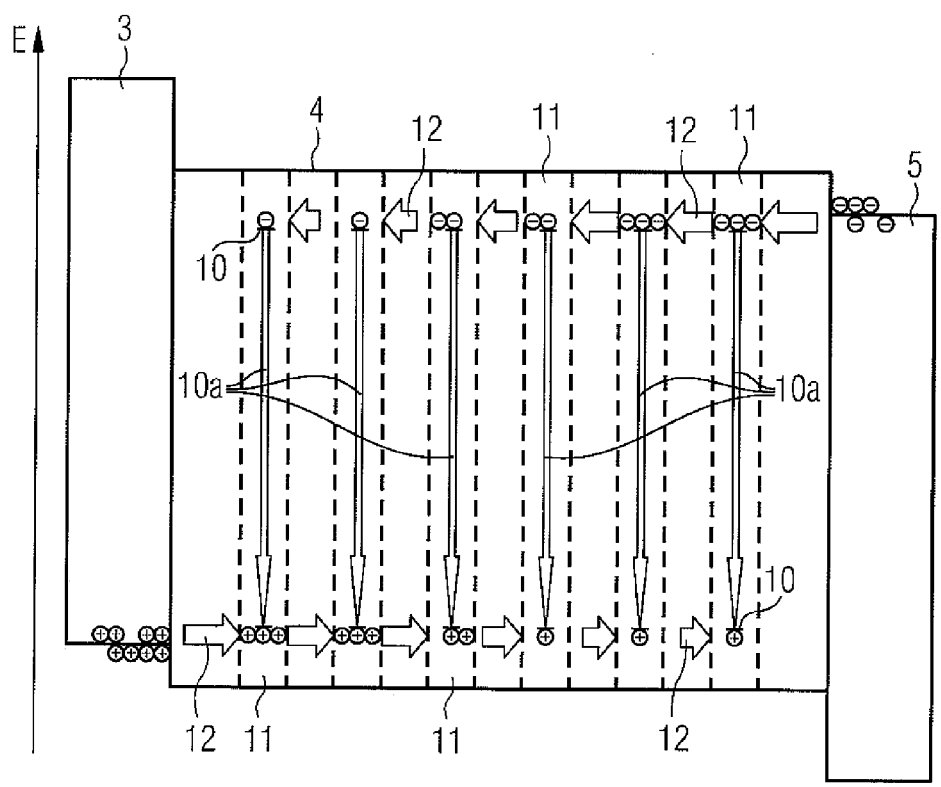

In conjunction with FIG. 2, a radiation-emitting region 4 for an exemplary embodiment of a component described here is explained in greater detail on the basis of a schematic illustration. The radiation-emitting region comprises a multiplicity of layers 10, each containing a matrix material and an emitter material. In the present case, the layers 10 comprising emitter material each contain the same emitter material, such that an emission 10a of electromagnetic radiation in the same wavelength range takes place in all layers 10 comprising emitter material. The layers 10 comprising emitter material are embedded in layers 11 comprising matrix material.

The layers 11 comprising matrix material preferably contain two matrix materials, an electron-conducting matrix material and a hole-conducting matrix material. FIG. 2 schematically illustrates the fact that charge carriers are initially blocked at the interface layers of layers comprising matrix material 11 with an electron barrier layer 3 and a hole barrier layer 5, respectively, and space charges form as a result. Charge carriers are subsequently initiated in the radiation-emitting region 4, said charge carriers respectively being trapped in layers comprising emitter material at molecules of the emitter material. The charge carriers partly recombine, which results in the emission 10a of electromagnetic radiation. However, portions of the totality of the charge carriers tunnel through adjacent layers comprising emitter material. In this case, the differing length of the dark arrows in FIG. 2 symbolizes the tunneling probability, which is dependent on the number of charge carriers, the layer thickness of the layers 11 comprising matrix material between the layers 10 comprising emitter material and also on the height of the barrier between the layers.

In this case, the layer thickness for the layers 10 comprising emitter material preferably lies in the monolayer or submonolayer range. In this case, layer thicknesses for layers consisting of matrix material can be chosen to be similar or larger. The small layer thicknesses described can be produced particularly precisely and reproducibly by means of atomic layer deposition, in particular. The arrangement described in FIG. 2 gives rise to emission 10a of electromagnetic radiation over the entire radiation-emitting region.

In FIG. 3, the situation described in conjunction with FIG. 2 is illustrated again on the basis of a schematic perspective illustration. This illustration better reveals the fact that the layers 10 comprising emitter material are at an energetically lower level than the layers 11 consisting of matrix material. In this way, an energy barrier formed from the matrix material or matrix materials without emitter material is arranged between the individual layers 10 containing an emitter material.

A further exemplary embodiment is explained in greater detail in conjunction with the schematic illustration in FIG. 4. In this exemplary embodiment, in contrast to the exemplary embodiments in FIGS. 2 and 3, the layers 10 comprising emitter material, which contain a matrix material and an emitter material, are surrounded by layers 14 formed with barrier material. The barrier material is distinguished by a higher band gap than the matrix material.

In the exemplary embodiment in FIG. 4, layers 10 comprising emitter material and layers 13 consisting of at least one barrier material are arranged alternately. Charge carriers in this exemplary embodiment have to overcome a higher energy barrier in order to pass from a layer 10 comprising emitter material into an adjacent layer 10 comprising emitter material. The charge carrier component in the layers 10 comprising emitter material is improved in this way.

In this case, the barrier material of the layers 14 comprising barrier material has both hole- and electron-blocking properties. It has the further advantage that—in contrast to a structure as described in conjunction with FIGS. 2 and 3—excitons, in particular, are prevented particularly well from diffusing from one layer 10 comprising emitter material into another layer 10 comprising emitter material. In this case, the barrier material in the layers 14 can be chosen in such a way that it blocks electrons particularly well, holes particularly well, or both types of charge carrier equally well. By varying the thickness of the layers 14 comprising barrier material, it is possible to set the tunneling probability between two layers 10 comprising emitter material. Preferably, all layers of the radiation-emitting region 4 are produced by means of atomic layer deposition in this case.

The structure presented in conjunction with FIG. 4 can also be designated as an organic quantum well structure. It is distinguished in particular by the fact that the charge carrier trapping in the individual layers 10 comprising emitter material is particularly good. Furthermore, on account of the production method—atomic layer deposition—the layer thickness of the emitter layers can be controlled particularly well. That leads in combination to a component which can be produced with particularly good reproducibility and in which the emission 10a has a particularly small line width. That is to say, particularly pure light having a specific wavelength or in a specific wavelength range can be generated. In the exemplary embodiment described in conjunction with FIG. 4, in this case the same emitter material is used in each layer 10 comprising emitter material.

Figure 5:
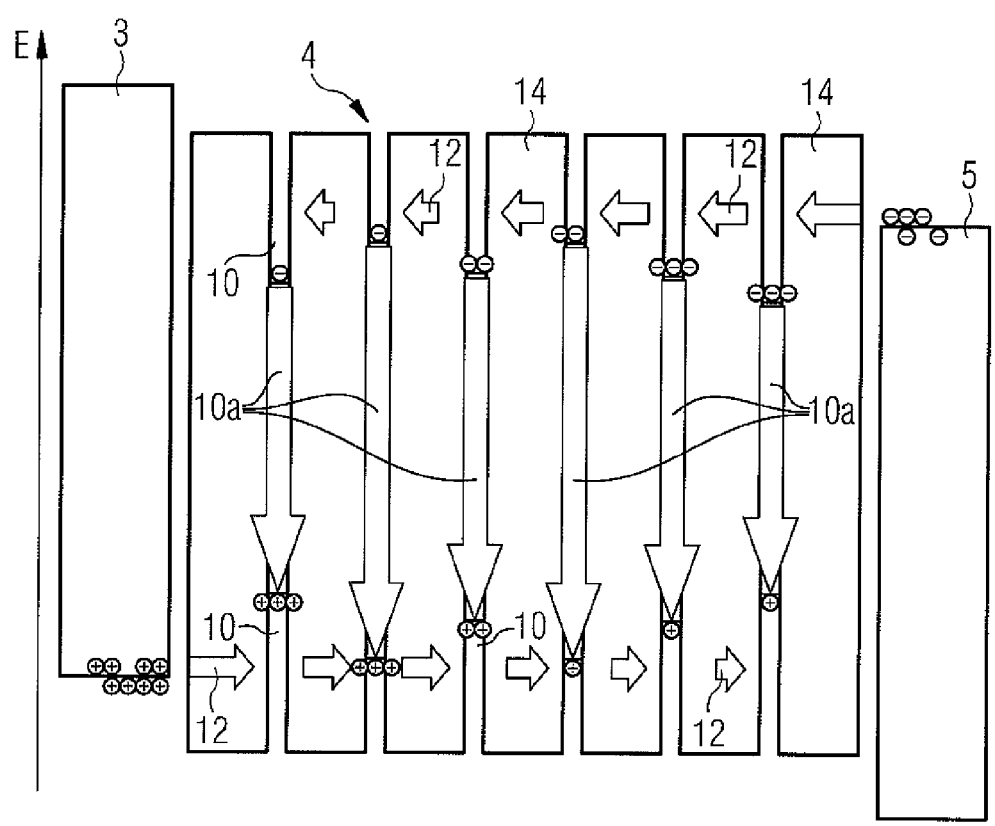

In contrast to this, on the basis of schematic illustration in FIG. 5, an exemplary embodiment is explained in which different emitter materials are used in the layers 10 comprising emitter material. In this case, the thickness of the individual layers 14 comprising barrier material can be adapted to the different HOMO and LUMO levels of the different emitter materials. Furthermore, different barrier materials can be used in the layers 14 comprising barrier material, depending on which barrier material is best suited to the adjoining emitter. Such structures can be produced in a particularly simple manner by means of atomic layer deposition.

In this case, the layers 10 comprising emitter material are arranged at locations at which the probability of emission is particularly high. On account of the use of different emitter materials, the component can emit mixed radiation, for example white light. In this case, different emitter materials can alternate, that is to say that adjacent layers 10 comprising emitter material each comprise a different emitter material. However, it is also possible for the layers comprising emitter material to be arranged in each case in groups, wherein each group comprises a plurality of layers 10 comprising emitter material, the same emitter material being used within the group.

Figure 6A:
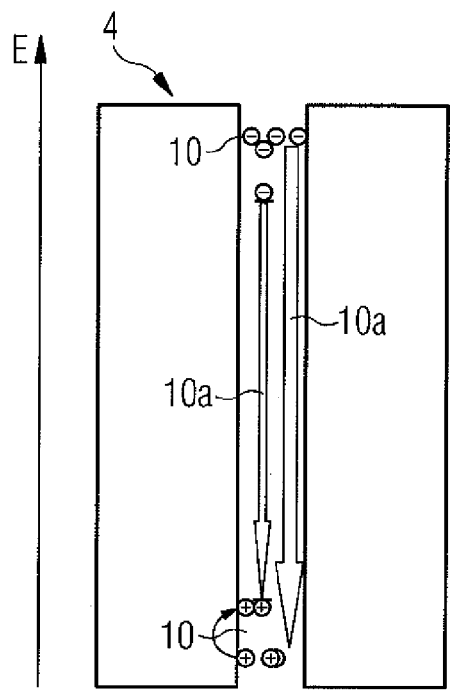
Figure 6B:
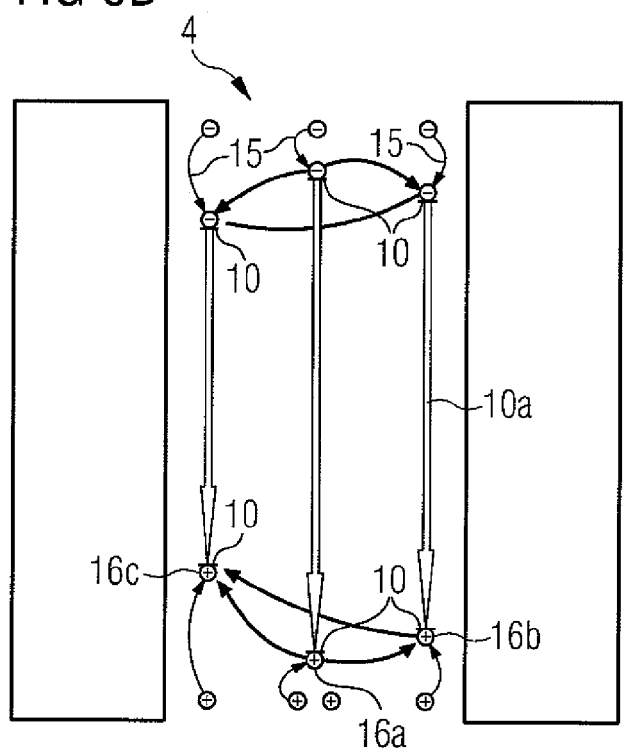

A further exemplary embodiment of a component described here is explained in greater detail in conjunction with FIGS. 6A and 6B. In this case, FIGS. 6A and 6B show different possibilities for the emission of electromagnetic radiation.

In the exemplary embodiment described in conjunction with FIG. 6A, red and green emitter materials are introduced in layers 10. In this case, the matrix material for these emitter materials, and the matrix material for the layers 11 consisting of matrix material are formed from a blue emitting material. In this way, therefore, electromagnetic radiation is also emitted by the layers 11 consisting of a matrix material. In this case, the red and green emitting materials preferably emit in a phosphorescent fashion.

Another possibility for the emission of electromagnetic radiation having different wavelengths is described in conjunction with FIG. 6B. In this case, layers 10 comprising different emitter materials are surrounded by layers 11 consisting of matrix material. In this case, as symbolized by the black arrows 15, charge carriers can be directly trapped by the layers 10. Furthermore, it is possible for charge carriers to be trapped by the blue emitter 16a, for example, and to relax from there to the emitter materials at an energetically low level, that is to say the green emitter material 16b and red emitter material 16c. In this exemplary embodiment, the matrix material itself is not emissive.

Materials which are suitable for producing a component described here are described for example in the document DE 102007058005.5, the disclosure content of which with respect to the materials described there is hereby expressly incorporated by reference.

The invention is not restricted to the exemplary embodiments by the description on the basis of said exemplary embodiments. Rather, the invention encompasses any novel feature and also any combination of features which, in particular includes any combination of features in the patent claims, even if this feature or this combination itself is not explicitly specified in the patent claims or exemplary embodiments.

The invention claimed is:

1. A method for producing a radiation emitting region of an organic radiation-emitting component, comprising:
   producing, by atomic layer deposition, at least two first layers, each first layer consisting of a matrix material formed of a fluorescent emitter material configured to emit radiation in the wavelength region of blue light;
   producing, by atomic layer deposition, at least two second layers, each second layer being produced between two first layers and comprising a different phosphorescent emitter material configured to emit radiation having wavelengths greater than the wavelength region of blue light,
   wherein the at least two second layers each have a thickness of at most 2 nm, and
   wherein the opto-electronic radiation-emitting component is configured to emit white light.

2. The method according to claim 1, further comprising:
   producing at least one layer consisting of at least one barrier material in the radiation-emitting region of the component, wherein the barrier material has a larger band gap than the matrix material.

3. The method according to claim 2, comprising producing the at least one barrier material by atomic layer deposition.

4. The method according to claim 1, comprising introducing at least a portion of a second layer into a first layer during production of the second layer.

5. An organic, radiation-emitting component comprising:
   a radiation-emitting region comprising:
   at least two first layers produced by atomic layer deposition, each of the at least two first layers consisting of matrix material formed of a fluorescent emitter material configured to emit radiation having a wavelength in the blue light radiation region;
   at least two second layers produced by atomic layer deposition, each second layer being between two first layers and comprising a different phosphorescent emitter material configured to emit radiation having wavelengths greater than the wavelength region of blue light,
   wherein the second layers each have a thickness of at most 2 nm; and
   wherein the opto-electronic radiation-emitting component is configured to emit white light.

6. The organic, radiation-emitting component according to claim 5, wherein the radiation-emitting region further comprises at least one layer consisting of at least one barrier material having a larger band gap than the matrix material.

7. The organic, radiation-emitting component according to claim 6, wherein the radiation-emitting region further comprises:
   at least two layers each consisting of at least one barrier material; and
   at least one layer containing an emitter material between two of the at least two layers consisting of the at least one barrier material.

8. The organic, radiation-emitting component according to claim 5, wherein at least a portion of a second layer is at least partially embedded in a first layer.

* * * * *